(12) United States Patent
Santhanam et al.

(10) Patent No.: US 7,723,219 B2
(45) Date of Patent: May 25, 2010

(54) PLASMA IMMERSION ION IMPLANTATION PROCESS WITH REDUCED POLYSILICON GATE LOSS AND REDUCED PARTICLE DEPOSITION

(75) Inventors: Kartik Santhanam, Fremont, CA (US); Manoj Vallaikal, Sunnyvale, CA (US); Peter I. Porshnev, San Jose, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 105 days.

(21) Appl. No.: 12/072,118

(22) Filed: Feb. 22, 2008

(65) Prior Publication Data
US 2009/0215250 A1 Aug. 27, 2009

(51) Int. Cl.
*H01L 21/425* (2006.01)

(52) U.S. Cl. ............... 438/515; 438/513; 257/E21.316; 257/E21.143

(58) Field of Classification Search ............ 438/513, 438/515, 565; 257/E21.556, E21.467, E21.135, 257/E21.143, E21.315, E21.316
See application file for complete search history.

(56) References Cited

U.S. PATENT DOCUMENTS

| | | | | |
|---|---|---|---|---|
| 2002/0022354 | A1* | 2/2002 | Furukawa et al. | 438/586 |
| 2003/0038246 | A1 | 2/2003 | Reyes et al. | 250/426 |
| 2006/0166507 | A1* | 7/2006 | Sharan et al. | 438/710 |
| 2007/0026649 | A1* | 2/2007 | Okumura et al. | 438/510 |
| 2008/0317968 | A1* | 12/2008 | Singh et al. | 427/523 |

OTHER PUBLICATIONS

English Abstract of Korean Application Publication No. 10-2006-0001011A, Korea Institute of Science and Technology, Jan. 6, 2006.
English Abstract of Korean Application Publication No. 10-2001-0028157A, Institute for Advanced Engineering, Apr. 6, 2001.
* cited by examiner

*Primary Examiner*—Caridad M Everhart
(74) *Attorney, Agent, or Firm*—Law Office Of Robert M. Wallace

(57) ABSTRACT

In plasma immersion ion implantation of a polysilicon gate, a hydride of the dopant is employed as a process gas to avoid etching the polysilicon gate, and sufficient argon gas is added to reduce added particle count to below 50 and to reduce plasma impedance fluctuations to 5% or less.

18 Claims, 2 Drawing Sheets

PLASMA IMMERSION ION IMPLANTATION PROCESS WITH REDUCED POLYSILICON GATE LOSS AND REDUCED PARTICLE DEPOSITION

BACKGROUND

Plasma immersion ion implantation is performed by generating a plasma containing ions of species to be implanted in a semiconductor wafer or workpiece. The plasma may be generated using a plasma source such as a toroidal plasma source at the reactor chamber ceiling. Ion energy sufficient to achieve a desired ion implantation depth profile below the wafer surface is provided by coupling a very high RF bias voltage (e.g., 10 kV to 20 kV) to the semiconductor wafer through an insulated cathode electrode within the wafer support pedestal. High implant dose rate requires a high plasma ion density, which is achieved using a toroidal plasma source operating at a low chamber pressure. The requisite ion implant depth profile requires a very high ion energy, which is achieved by applying a very high RF bias voltage across the plasma sheath at the wafer surface. The process gas employed in plasma immersion ion implantation can be a fluoride or a hydride of the dopant species to be implanted.

In DRAM/flash memory fabrication, it is necessary to implant a semiconductor dopant species into the polycrystalline silicon (polysilicon) gate electrodes to increase their conductivity. The gate electrodes are formed by depositing amorphous silicon on a thin gate oxide layer and then annealing the wafer sufficiently to transform the deposited silicon from the amorphous state to a polycrystalline state. The polycrystalline silicon gate layer thus formed is about 50 nm to 80 nm thick. The implanted species is one that promotes p-type semiconductivity in silicon, such as boron, or n-type semiconductivity, such as arsenic, phosphorous or antimony. There is a need to avoid sputtering of the polycrystalline silicon gate material during the plasma immersion ion implantation. Specifically, it is desirable to minimize sputtering-induced reduction in the gate thickness to less than 10% of initial gate thickness (e.g., not more than a 5 nm to 8 nm loss in gate thickness) during the entire plasma immersion ion implantation process. The plasma immersion ion implantation process must be carried out for a sufficient time to attain a required ion implant dosage in the polysilicon gate layer, corresponding to an electrical resistivity in the range of 100-2000 Ohm/sq.

There is a further need to maintain a stable plasma to minimize plasma impedance fluctuations that would cause fluctuations in the delivered RF bias power or RF bias voltage across the plasma sheath and fluctuations in the delivered RF source power of the toroidal source. Otherwise, fluctuations in the delivered RF bias power will degrade control over ion implantation depth profile, while fluctuations in delivered RF source power will degrade control over ion implant dosage or dose rate. Currently, certain plasma immersion ion implantation processes experience frequent sporadic fluctuations in plasma impedance on the order of 100%. There is a need to reduce such fluctuations.

There is a need to reduce the deposition of solid particles on the wafer surface during plasma immersion ion implantation. Such particle deposition can occur due to (for example) accumulation of plasma by-products as a film on the chamber interior surfaces, such a film being liable to flaking from the sputtering action of the plasma. Currently, for example, certain plasma immersion ion implantation processes tend to accumulate between about 500 and 5000 particles of diameters of at least 0.12 microns on a 300 mm diameter wafer during ion implantation doping of polysilicon gates of flash memories. There is a need to reduce this particle deposition by an order of magnitude, e.g., to a range between about 5 and 50 particles of at least 0.12 microns.

SUMMARY

A process is provided for fabricating a semiconductor device. The process includes forming a gate dielectric layer on a silicon substrate, forming a polycrystalline silicon gate layer on the gate dielectric layer and then defining gate electrodes in the polycrystalline silicon gate layer. The silicon substrate on a wafer support surface in a reactor chamber and introducing into the chamber a first process gas of more than 50% helium and less than 50% dopant hydride gas, at a first flow rate, and introducing into the chamber Argon gas at a second flow rate that is within a factor of 10 of the first flow rate. RF plasma source power is applied to a toroidal plasma source of the chamber to generate a plasma from the first process gas and Argon gas. Sufficient RF bias power is coupled to the wafer to generate a bias voltage on the wafer corresponding to a desired ion implantation depth profile.

In an embodiment, the flow rate of the argon gas is sufficient to minimize plasma impedance fluctuations to about 5%. In a related embodiment, the flow rate of argon gas is sufficient to limit added particle count during the process on the wafer to less than 50 particles of size greater than 0.12 nm.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
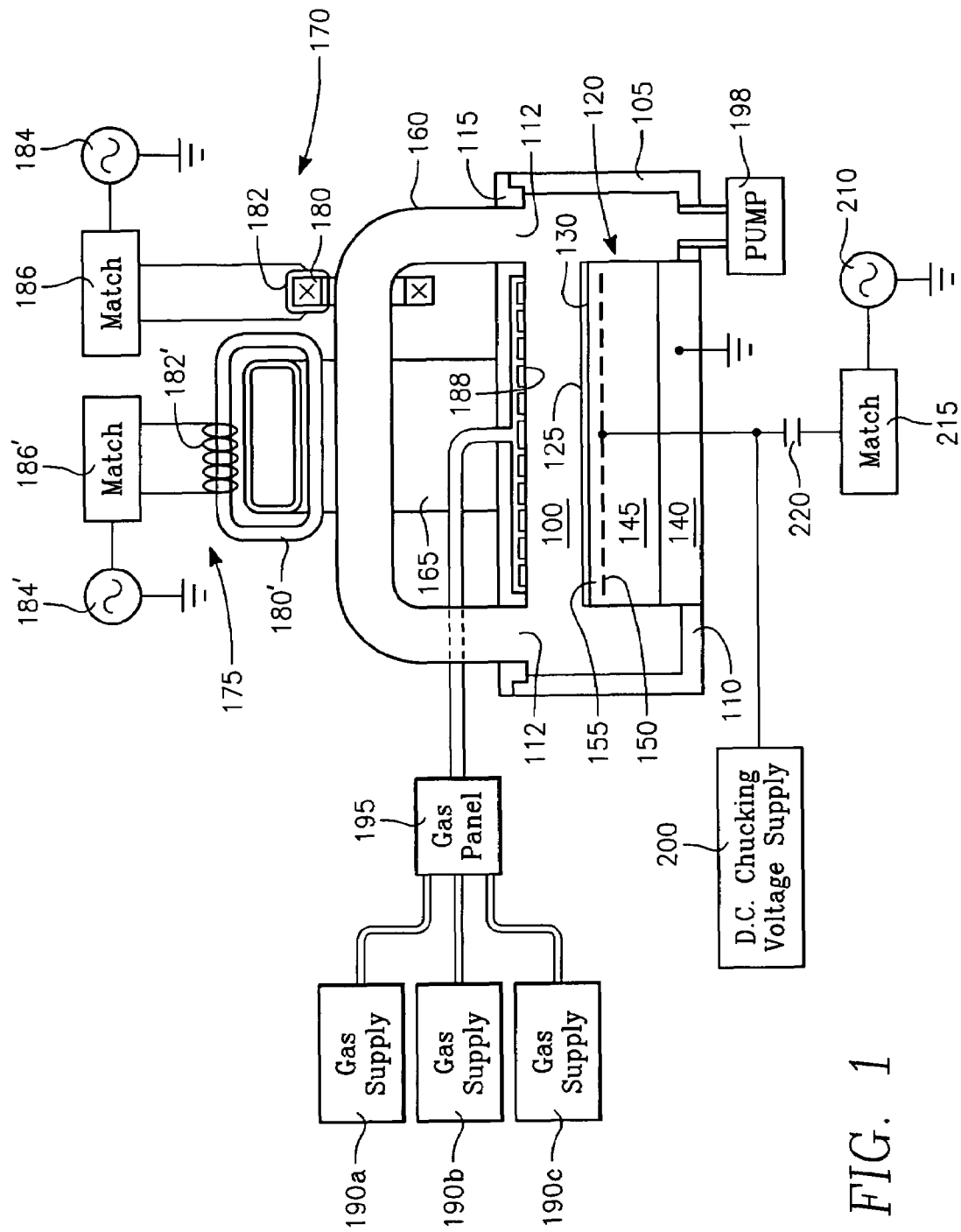
FIG. 1 is a simplified diagram of a plasma reactor employed in a process of one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

The ion dose rate of plasma immersion ion implantation depends upon the selection of the process gas. For example, the highest dose rate for implanting boron into silicon can be achieved by using a fluoride of the dopant species. For implanting boron, the process gas boron tri-fluoride, $BF_3$, provides the highest dose rate. The problem with such a fluoride gas is that, in a plasma, it dissociates into boron ions and into fluoride species including atomic fluorine. The dissociated fluoride species etches away the polysilicon gate layer at an unacceptably high rate during the entire plasma immersion ion implantation process. This etching occurs at such a high rate that the polysilicon gate layer thickness is reduced from its initial thickness (50-80 nm) down to onehalf or less of that initial thickness. The remaining thickness is unacceptably small, and therefore fluorides of dopants such as $BF_3$ cannot be used.

Etching of the polysilicon gate layer can be avoided almost entirely by employing a hydride of the desired dopant species as the process gas for plasma immersion ion implantation, such as diborane, $B_2H_6$, rather than $BF_3$. This solves the polysilicon etch problem. Specifically, in one example, the initial 50 nm-80 nm polysilicon gate thickness is reduced by less than 10% during the entire ion implantation process using a hydride such as $B_2H_6$. However, the use of a hydride of the dopant (e.g., $B_2H_6$) creates two new problems that are equally severe.

One of the new problems is that the hydrogen component of the process gas (e.g., $B_2H_6$) promotes formation of particles in the chamber that accumulates on the wafer surface as contamination. This can occur, for example, through deposition of plasma by-products as a film on chamber interior surfaces, which is then sputtered by the plasma to produce the particles. The effect is that during a single plasma ion implantation process, one 300 mm diameter wafer will receive 500 to 5000 particles having diameters exceeding 0.12 microns in diameter. This amount of particles added to the wafer is unacceptably high.

Another problem arises from the tendency of a hydride of a dopant species to decompose at a relatively high rate, so that it cannot be stored in its pure state. The decomposition problem is only avoided by mixing the gaseous hydride of the dopant (e.g., $B_2H_6$) with the lightest inert gas, He. The mixture must dilute the hydride (e.g., $B_2H_6$) to a very high degree, so that 50% to 90% of the mixture is He gas while the small remainder is the hydride gas. For example, one process gas consists of 10% $B_2H_6$ gas and 90% He gas. The problem is that the He component of this gas tends to destabilize the plasma, so that the RF impedance of the plasma fluctuates sporadically by as much as 100%. One result is that the RF voltage delivered across the plasma sheath by the RF bias power generator fluctuates excessively so that the ion implantation depth profile cannot be reliably controlled. Another result is that the RF power delivered to the plasma by the RF source power generators of the toroidal plasma source fluctuates so that the plasma ion density and (therefore) ion implant dose cannot be reliably controlled. Therefore, the use of a process gas consisting of a hydride of the desired dopant introduces unacceptable problems in plasma immersion ion implantation.

What is desired is a plasma immersion ion implantation process employing a dopant-containing process gas that completely avoids all of the foregoing problems at the extremely high ion energy levels and low chamber pressure levels of the process. Our process fulfills that need. In our process, a hydride of the dopant is employed in the process gas diluted with He gas. In addition a certain proportion of a heavier inert gas, namely Ar, is injected into the chamber along with the He-diluted dopant hydride gas. Several surprising results are realized. First, the addition of Ar to the process gas does not appreciably increase the etching of the polysilicon gate layer beyond that observed in the absence of Ar. That is, the initial 50 nm-80 nm polysilicon gate thickness is reduced by less than 10% during the entire ion implantation process in the presence of Ar gas in the dopant hydride gas (e.g., $B_2H_6$+He). Secondly, the addition of the Ar gas to the process gas mixture solves the problem of particulate deposition on the wafer characteristic of a dopant-hydride process gases. Third, the presence of the Ar solves the problem of plasma instability or plasma impedance fluctuations that have been unavoidable with dopant-hydride gases, such as $B_2H_6$.

The first surprising result, the ability to supplement the dopant-hydride process gas with Ar without increasing the polysilicon gate loss beyond 10%, was wholly unexpected, because Ar gas is typically added to a plasma process gas in various etch processes to promote sputtering and etch rate. Because of its great effectiveness in this, Ar use has been generally confined to plasmas with higher pressure (e.g., on the order of 1 Torr) and lower ion energies (e.g., RF bias voltages on the order of hundreds of volts). Use of Ar in plasmas at lower chamber pressures and/or higher ion energies or bias voltages has led to excessive or uncontrollable sputtering or etch rates. Therefore, in the toroidal source plasma immersion ion implantation process that employs a high RF bias voltage (e.g., thousands of volts across the plasma sheath) and low chamber pressure (e.g., on the order of mT), it would be expected that the addition of Ar gas to the dopant-hydride gas would cause a very severe loss of polysilicon gate thickness. But, the opposite result is obtained: the polysilicon gate thickness loss is less than 5 nm, or not much more than it is in the absence of Ar. Therefore, this result is entirely unexpected.

The second surprising result, the reduction in particle count with the addition of Ar, was observed to be a particle count reduction of an order of magnitude. Specifically, without Ar gas, use of $B_2H_6$ is characterized by added particle counts of 500-5000 for particle sizes in excess of 0.12 nm. With the introduction of Ar, the particle count added by the plasma immersion ion implantation process is reduced by an order of magnitude, e.g., down to an added particle count of less than 50.

The third surprising result was indicated by a reduction in plasma impedance fluctuations of about 100% in the absence of Ar down to less than 5% with the addition of Ar. An advantage of this result is that ion implantation depth profile and dose rate are both controlled with great precision.

A toroidal source plasma immersion ion implantation reactor in which the process is performed is now described. Referring to FIG. 1, a plasma immersion ion implantation reactor has a chamber 100 enclosed by a cylindrical side wall 105, a floor 110 and a ceiling 115. A wafer support pedestal 120 within the chamber 100 may be an electrostatic chuck capable of electrostatically clamping a semiconductor wafer 125 onto a wafer support surface 130 of the chuck 120. The chuck 120 may consist of a grounded conductive base layer 140, an insulating layer 145 overlying the base layer 140, a thin cathode electrode 150 overlying the insulating layer 145, and a top insulating layer 155 overlying the cathode electrode 150 and forming the wafer support surface 130. The material of the insulating layers 145, 155 may be a ceramic material. The cathode electrode 150 may be a thin metallic mesh formed of molybdenum.

The reactor of FIG. 1 has a toroidal plasma source including a pair of transverse external reentrant conduits 160, 165 each extending across the diameter of the chamber 100 and coupled at their ends to the interior of the chamber 100 through ports 112 in the ceiling 115. RF power applicators 170, 175 couple RF power into the interior of the reentrant conduits 160, 165 respectively. The RF power applicator 170 consists of a magnetically permeable ring 180 wrapped around the conduit 160, a conductive coil 182 wrapped around a portion of the ring 180 and an RF power generator 184 coupled to the coil 182 through an RF impedance match element 186. The RF power applicator 175 consists of a magnetically permeable ring 180' wrapped around the conduit 165, a conductive coil 182' wrapped around a portion of the ring 180' and an RF power generator 184' coupled to the coil 182' through an RF impedance match element 186'.

The ceiling 115 includes a gas distribution plate 188. Process gas supplies 190a, 190b, 190c furnish process gas through a user-controllable gas panel 195 to the gas distribution plate 188. The chamber 100 is evacuated by a vacuum pump 198. In one example, the gas supply 190a contains the He-dilute dopant hydride gas. The dopant hydride may be a hydride of boron, phosphorus, arsenic or antimony, or the like. In one example, the dopant hydride was $B_2H_6$, and the He-diluted gas mixture of the gas supply 190a was 10% $B_2H_6$ and 90% He. In this same example, the gas supply 190b stores Ar gas. The gas supply 190c may store a process gas for another use, such as a precursor of a passivation or seasoning species, for example.

The electrostatic chuck 120 further includes a user-controllable D.C. chucking voltage supply 200 connected to the mesh electrode 150. An RF bias power generator 210 capable of generating extremely high RF bias voltages is coupled to the mesh electrode 150 through an RF impedance match circuit 215 and through an optional isolation capacitor 220 (which may be included in the impedance match circuit 215). In order to provide a useful ion implantation depth profile in the wafer 125, the RF bias voltage generator 210 is operated at a sufficiently high power level to produce an RF bias voltage across the plasma sheath at the wafer surface on the order of 10 kV or more. This voltage controls the ion implantation depth profile.

In one working example, a plasma immersion ion implantation process for increasing the conductivity of a polysilicon gate layer of 50 nm-80 nm thickness was carried out as follows: The gas panel 195 provided a gas flow rate of 50-200 sccm (standard cubic centimeters per minute) of the $B_2H_6$+He gas mixture from the gas supply 190a, and a gas flow rate of 20-300 sccm of Ar gas from the gas supply 190b to the ceiling gas distribution plate 188. The toroidal plasma source power generators 184, 184' each produced 200-5000 Watts of RF power at about 13.56 MHz, each being slightly offset in frequency from the other by a fraction of 1 MHz. This frequency is exemplary only, and may lie anywhere in a range of about 5-30 MHz. The bias power generator 210 provided sufficient RF power at a frequency of about 2 MHz to produce an RF bias voltage across the plasma sheath over the wafer 125 of about 200-15,000 volts. The bias power RF frequency may lie anywhere in a range of 0.5-4 MHz although it may range as high as 60 MHz. The vacuum pump 198 operated at an evacuation rate sufficient to maintain the chamber pressure in a range of 3-100 mT.

Figure 2:
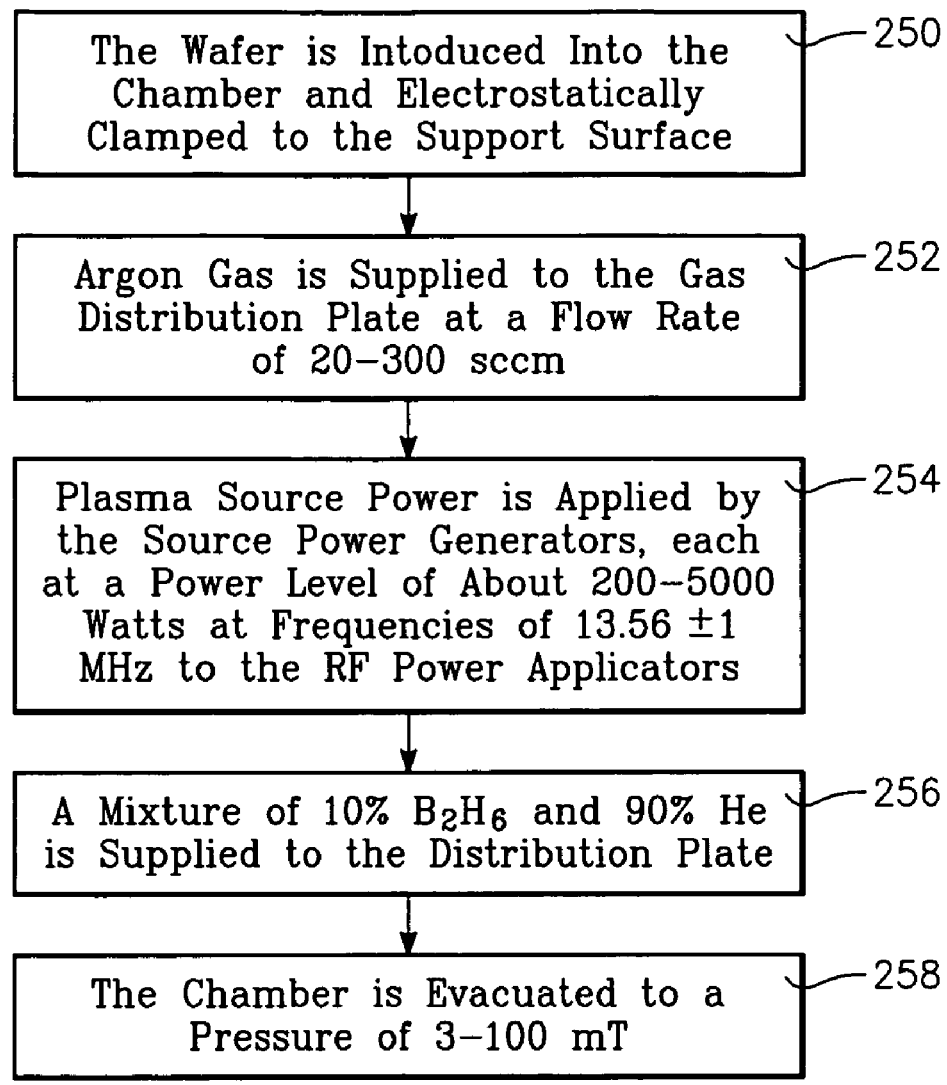
FIG. 2 depicts a process in accordance with one embodiment.

FIG. 2 depicts a process in one embodiment. The wafer 125 is introduced into the chamber 100 and placed on the wafer support surface 130, and an electrostatic clamping force is applied to the chuck 120 by the chucking voltage supply 200, using a voltage on the order of thousands of volts if a large RF bias voltage is to be applied (block 250 of FIG. 2). Argon gas is supplied to the gas distribution plate at a flow rate of 20-300 sccm (block 252). Plasma source power is applied by the source power generators 184, 184' each at a power level of about 200-5000 Watts at frequencies of 13.56±1 MHz to the RF power applicators 170, 175 (block 254). A mixture of 10% $B_2H_6$ and 90% He is supplied to the gas distribution plate 188 (block 256). The chamber 100 is evacuated to a pressure of 3-100 mT (block 258). These conditions are maintained for a sufficient time to reach a required implanted dose of boron ions. This dose may correspond to an electrical resistivity of the implanted polysilicon gate material of less than $10^8$ Ohm-meters. At that point, the ion implantation process is complete and is halted and the wafer 125 is de-chucked and removed.

While the foregoing is directed to embodiments of the present invention, other and further embodiments of the invention may be devised without departing from the basic scope thereof, and the scope thereof is determined by the claims that follow.

What is claimed is:

1. A process for fabricating a semiconductor device, comprising:
   forming a gate dielectric layer on a silicon substrate;
   forming a polycrystalline silicon gate layer on the gate dielectric layer;
   defining gate electrodes in said polycrystalline silicon gate layer;
   holding the silicon substrate on a support surface in a reactor chamber;
   introducing into the chamber a first process gas comprising more than 50% of helium and less than 50% of a dopant hydride gas, at a first flow rate;
   introducing into the chamber Argon gas at a second flow rate that is within a factor of 10 of said first flow rate;
   applying RF plasma source power to a toroidal plasma source of the chamber to generate a plasma from said first process gas and Argon gas; and
   coupling sufficient RF bias power to said wafer to generate a bias voltage on said wafer corresponding to a desired ion implantation depth profile;
   wherein said applying RF plasma source power comprises coupling RF source power to the interior of each of a pair of mutually transverse external reentrant conduits of said chamber.

2. The process of claim 1 wherein said dopant hydride is a hydride of a dopant impurity for silicon.

3. The process of claim 1 wherein said dopant hydride is a hydride of one of boron, phosphorus, arsenic, or antimony.

4. The process of claim 1 wherein said first flow rate is between 50 and 200 sccm and said second flow rate is between 20 and 300 sccm.

5. The process of claim 1 wherein the RF source power coupled to each conduit has an RF frequency of about 13.56 MHz and a power on the order of 200-5000 Watts.

6. The process of claim 1 wherein said RF bias power has a frequency between 0.5 and 60.0 MHz.

7. The process of claim 1 wherein said second flow rate is sufficient for argon gas to minimize plasma impedance fluctuations to about 5%.

8. The process of claim 1 wherein said second flow rate is sufficient to limit added particle count during the process on said wafer to less than 50 particles of size greater than 0.12 nm.

9. The process of claim 1 wherein said dopant hydride comprises diborane.

10. A process for implanting a dopant impurity species into a semiconductor wafer by plasma immersion ion implantation, comprising:
    holding the semiconductor wafer on a wafer support surface in a reactor chamber;
    introducing into the chamber a first process gas comprising more than 50% of helium and less than 50% of a dopant hydride gas, at a first flow rate;
    introducing into the chamber Argon gas at a second flow rate that is within a factor of 10 of said first flow rate;
    applying RF plasma source power to a toroidal plasma source of the chamber to generate a plasma from said first process gas and Argon gas; and
    coupling sufficient RF bias power to said wafer to generate a bias voltage on said wafer corresponding to a desired ion implantation depth profile;

wherein said applying RF plasma source power comprises coupling RF source power to the interior of each of a pair of mutually transverse external reentrant conduits of said chamber.

11. The process of claim 10 wherein said wafer comprises silicon and said dopant hydride is a hydride of a dopant impurity for silicon.

12. The process of claim 10 wherein said dopant hydride is a hydride of one of boron, phosphorus, arsenic, or antimony.

13. The process of claim 10 wherein said first flow rate is between 50 and 200 sccm and said second flow rate is between 20 and 300 sccm.

14. The process of claim 10 wherein the RF source power coupled to each conduit has an RF frequency of about 13.56 MHz and a power on the order of 200-5000 Watts.

15. The process of claim 10 wherein said RF bias power has a frequency between 0.5 and 60.0 MHz.

16. The process of claim 10 wherein said second flow rate is sufficient for argon gas to minimize, plasma impedance fluctuations to about 5%.

17. The process of claim 10 wherein said second flow rate is sufficient to limit added particle count during the process on said wafer to less than 50 particles of size greater than 0.12 nm.

18. The process of claim 10 wherein said dopant hydride comprises diborane.

* * * * *